(12) United States Patent
Lee

(10) Patent No.: US 9,247,632 B2
(45) Date of Patent: Jan. 26, 2016

(54) COVER STRUCTURE AND MANUFACTURING METHOD THEREOF

(71) Applicant: Ying-Ming Lee, Hsinchu County (TW)

(72) Inventor: Ying-Ming Lee, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 14/228,277

(22) Filed: Mar. 28, 2014

(65) Prior Publication Data
US 2015/0216032 A1    Jul. 30, 2015

(30) Foreign Application Priority Data
Jan. 29, 2014  (TW) .............................. 103103585 A

(51) Int. Cl.
| H05K 1/02 | (2006.01) |
| H05K 9/00 | (2006.01) |
| C25D 5/02 | (2006.01) |
| C25D 7/00 | (2006.01) |
| B32B 37/02 | (2006.01) |
| B32B 38/10 | (2006.01) |
| B32B 37/24 | (2006.01) |

(52) U.S. Cl.
CPC .............. H05K 1/0216 (2013.01); B32B 37/02 (2013.01); C25D 5/022 (2013.01); C25D 7/00 (2013.01); H05K 9/0088 (2013.01); B32B 38/10 (2013.01); B32B 2037/243 (2013.01); B32B 2307/202 (2013.01); B32B 2307/204 (2013.01); B32B 2307/206 (2013.01); B32B 2307/212 (2013.01); B32B 2311/12 (2013.01); B32B 2457/00 (2013.01); H01J 2211/446 (2013.01); H05K 2203/06 (2013.01)

(58) Field of Classification Search
None
See application file for complete search history.

(56) References Cited

U.S. PATENT DOCUMENTS

| 5,607,566 A * | 3/1997 | Brown et al. ................. 257/414 |
| 6,686,649 B1 * | 2/2004 | Mathews et al. .............. 257/659 |
| 7,396,700 B2 | 7/2008 | Hsu |
| 8,502,735 B1 * | 8/2013 | Moosbrugger et al. ....... 343/700 MS |

FOREIGN PATENT DOCUMENTS

TW          200509333           3/2005

OTHER PUBLICATIONS

"Office Action of Taiwan Counterpart Application", issued on Sep. 25, 2015, p1-p4, in which the listed references were cited.

* cited by examiner

Primary Examiner — Bilkis Jahan
Assistant Examiner — Kevin Quinto
(74) Attorney, Agent, or Firm — Jianq Chyun IP Office

(57) ABSTRACT

A method of manufacturing a cover structure is provided. A metal substrate disposed on a carrier is provided. The carrier has a surface, and the metal substrate has a plurality of openings exposing a portion of the surface. A first metal layer is formed on the metal substrate and is conformal with the metal substrate. The first metal layer covers the portion of the surface exposed by the openings. An insulating layer and a second metal layer located on the insulating layer are laminated on the metal substrate. The insulating layer is located between the first metal layer and the second metal layer to cover the first metal layer and fill the openings. The metal substrate and the carrier are removed to expose the first metal layer and define a plurality of cavity regions and a plurality of connecting regions connected with the cavity regions.

9 Claims, 13 Drawing Sheets

COVER STRUCTURE AND MANUFACTURING METHOD THEREOF

CROSS-REFERENCE TO RELATED APPLICATION

This application claims the priority benefit of Taiwan application serial no. 103103585, filed on Jan. 29, 2014. The entirety of the above-mentioned patent application is hereby incorporated by reference herein and made a part of this specification.

BACKGROUND OF THE INVENTION

1. Field of the Invention

The invention relates to a cover structure, and more particularly relates to a cover structure capable of precluding electro-magnetic interference (EMI) and a manufacturing method thereof.

2. Description of Related Art

Generally, an integrated circuit (IC) chip is electrically connected to a motherboard through a circuit board, so as to allow electronic signals to be transmitted between the IC chip and the motherboard. Nevertheless, as the clock frequency of the IC chip gets higher, the electronic signals suffer more from electro-magnetic interference (EMI). EMI usually interrupts, obstructs, reduces, or limits the performance of electronic devices or the overall circuit system. Therefore, an effective anti-EMI shield is required to ensure the efficiency and safe operation of the electronic devices or system. In order to prevent the stability of the IC chip from being affected by EMI, a metal cover is frequently disposed on top of the circuit board for avoiding electro-magnetic wave leakage or precluding the circuit board from being interfered by an external electro-magnetic wave.

SUMMARY OF THE INVENTION

The invention provides a cover structure having a function of precluding EMI.

The invention provides a manufacturing method for manufacturing the aforementioned cover structure.

The manufacturing method of the cover structure of the invention includes the following steps. A metal substrate is disposed on a carrier. The carrier has a surface, and the metal substrate has a plurality of openings exposing a portion of the surface of the carrier. The metal substrate has a first metal layer formed thereon, the first metal layer is disposed conformally with the metal substrate. The first metal layer covers the portion of the surface of the carrier exposed by the openings. An insulating layer and a second metal layer located on the insulating layer are laminated on the metal substrate. The insulating layer is located between the first metal layer and the second metal layer and covers the first metal layer and fills the openings. The metal substrate and the carrier are removed to expose the first metal layer and define a plurality of cavity regions and a plurality of connecting regions connected with the cavity regions, wherein positions of the cavity regions correspond to positions of the metal substrate, and positions of the connecting regions correspond to the positions of the openings.

In an embodiment of the invention, the step of removing a portion of the first metal layer located in the connecting regions includes: after removing the metal substrate and the carrier, forming a dry film layer on the second metal layer and the portion of the first metal layer located in the connecting regions; performing an electroplating process with the dry film layer as an electroplating mask to electroplate a third metal layer on a portion of the first metal layer exposed by the dry film layer; removing the dry film layer to expose the second metal layer and the portion of the first metal layer located in the connecting regions; removing the second metal layer and the portion of the first metal layer located in the connecting regions, which are exposed outside the third metal layer, with the third metal layer as an etching mask to expose an upper surface and a portion of a lower surface of the insulating layer; and removing the third metal layer to expose the first metal layer.

In an embodiment of the invention, the step of removing the metal substrate and the carrier includes: removing the carrier to expose a bottom surface of the metal substrate and the portion of the first metal layer located in the connecting regions; forming a third metal layer on the bottom surface of the metal substrate and the portion of the first metal layer located in the connecting regions; forming a plurality of conductive columns to penetrate the connecting regions, wherein the conductive columns penetrate the second metal layer, the insulating layer, the first metal layer, and the third metal layer; forming a fourth metal layer and a fifth metal layer respectively on the second metal layer and the third metal layer, wherein the fourth metal layer and the fifth metal layer respectively cover two opposite ends of the conductive columns; removing a portion of the fourth metal layer and a portion of the second metal layer to expose a portion of an upper surface of the insulating layer; forming an additional layer wiring structure on the exposed insulating layer; and removing a portion of the fifth metal layer, a portion of the third metal layer, the metal substrate, and the portion of the first metal layer located in the connecting regions to expose a portion of the first metal layer located in the cavity regions and a portion of a lower surface of the insulating layer located in the connecting regions.

In an embodiment of the invention, the additional layer wiring structure includes at least one dielectric layer, at least one patterned conductive layer, and at least one conductive through-hole structure penetrating the at least one dielectric layer. The at least one dielectric layer and the at least one patterned conductive layer are sequentially stacked on the insulating layer, and the at least one patterned conductive layer is electrically connected with the conductive columns via the at least one conductive through-hole structure and the fourth metal layer.

In an embodiment of the invention, the carrier includes a core dielectric layer and a copper foil layer. The core dielectric layer is located between the copper foil layer and the metal substrate.

In an embodiment of the invention, the manufacturing method of the cover structure further includes: after laminating the insulating layer and the second metal layer on the metal substrate, forming a plurality of conductive columns penetrating the second metal layer, the insulating layer, the first metal layer, the core dielectric layer, and the copper foil layer; forming a fourth metal layer and a fifth metal layer respectively on the second metal layer and the copper foil layer, wherein the fourth metal layer and the fifth metal layer respectively cover two opposite ends of the conductive columns; removing a portion of the fourth metal layer and a portion of the second metal layer to expose a portion of an upper surface of the insulating layer; forming an additional layer wiring structure on the exposed insulating layer; and removing a portion of the fifth metal layer, a portion of the core dielectric layer, a portion of the copper foil layer, the metal substrate, and the portion of the first metal layer located in the connecting regions to expose a portion of the first metal layer located in the cavity regions and a portion of a lower surface of the insulating layer located in the connecting regions.

In an embodiment of the invention, the additional layer wiring structure includes at least one dielectric layer, at least one patterned conductive layer, and at least one conductive through-hole structure penetrating the at least one dielectric layer. The at least one dielectric layer and the at least one patterned conductive layer are sequentially stacked on the insulating layer, and the at least one patterned conductive layer is electrically connected with the conductive columns via the at least one conductive through-hole structure and the fourth metal layer.

In an embodiment of the invention, the manufacturing method of the cover structure further includes: after removing the metal substrate and the carrier, performing a unitizing process to form a plurality of cover structures that are independent of each other.

The cover structure of the invention is adapted for covering a circuit board that carries at least one electronic device. The cover structure includes an insulating layer and a metal layer. The insulating layer has an upper surface, a lower surface opposite to the upper surface, and at least one cavity on the lower surface. The metal layer is disposed on the insulating layer and covers the at least one cavity and a portion of the lower surface. The circuit board is electrically connected with the metal layer on the lower surface of the insulating layer, and the electronic device is located between the circuit board and the metal layer.

In an embodiment of the invention, the cover structure further includes at least one conductive column and an additional layer wiring structure. The at least one conductive column penetrates the insulating layer and is embedded in the insulating layer. The additional layer wiring structure is disposed on the insulating layer and includes at least one dielectric layer, at least one patterned conductive layer, and at least one conductive through-hole structure penetrating the at least one dielectric layer. The at least one dielectric layer and the at least one patterned conductive layer are sequentially stacked on the insulating layer, and the at least one patterned conductive layer is electrically connected with the conductive column via the at least one conductive through-hole structure.

Based on the above, the manufacturing method of the cover structure of the invention is to form the structure of the cavity region utilizing the design of the metal substrate. The cover structure of the invention has the cavity on which the metal layer is disposed. Therefore, when the cover structure is positioned on the circuit board, the electronic device on the circuit board is located in the cavity, and the metal layer serves as an electro-magnetic wave shielding layer for effectively reducing the interference of an electro-magnetic wave from the outside and protecting the electronic device on the circuit board from being affected by signals.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
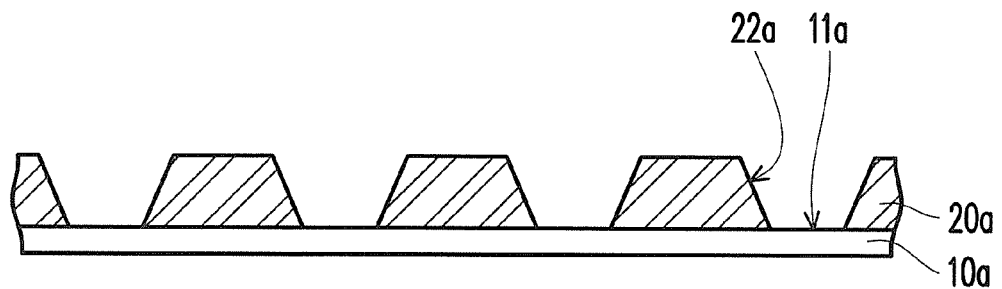
FIG. 1A to FIG. 1J are schematic cross-sectional views illustrating a manufacturing method of a cover structure of the invention.

FIG. 1A to FIG. 1J are schematic cross-sectional views illustrating a manufacturing method of a cover structure of the invention. With reference to FIG. 1A, in the manufacturing method of the cover structure of this embodiment, first a metal substrate 20a is disposed on a carrier 10a, wherein the carrier 10a has a surface 11a, and the metal substrate 20a has a plurality of openings 22a that expose a portion of the surface 11a of the carrier 10a. In this embodiment, a material of the metal substrate 20a is aluminum, for example. However, the invention is not limited thereto. The openings 22a are formed by coating a photoresist (not shown), exposing and developing the photoresist, and etching the metal substrate 20a outside the photoresist. Here, each of the openings 22a does not have a uniform diameter, and the diameter gradually decreases toward the surface 11a of the carrier 10a. However, it should be noted that the invention is not limited thereto. In other embodiments, the shapes of the openings 22a may be determined by a form of patterning the photoresist layer (not shown) or the energy used for etching.

Figure 1B:
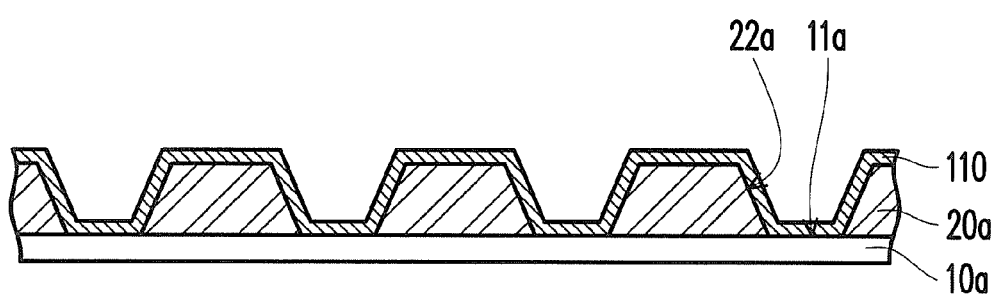

Next, referring to FIG. 1B, a first metal layer 110 is formed on the metal substrate 20a by electroplating, wherein the first metal layer 110 is disposed conformally with the metal substrate 20a, and the first metal layer 110 covers the portion of the surface 11a of the carrier 10a exposed by the openings 22a. Here, the first metal layer 110 is a continuous layer, and a material of the first metal layer 110 is copper, for example. However, it should be noted that the invention is not limited thereto.

Figure 1C:
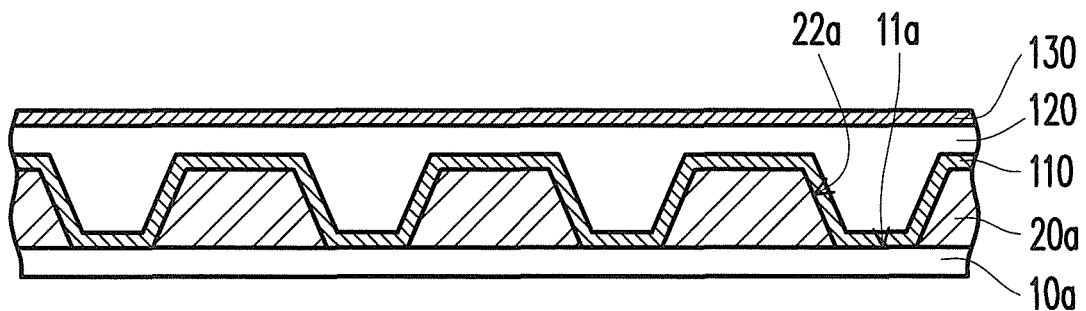

Then, referring to FIG. 1C, an insulating layer 120 and a second metal layer 130 located on the insulating layer 120 are laminated on the metal substrate 20a, wherein the insulating layer 120 is located between the first metal layer 110 and the second metal layer 130 and covers the first metal layer 110 and fills the openings 22a. Here, a material of the second metal layer 130 is a copper foil, for example. However, it should be noted that the invention is not limited thereto.

Figure 1D:
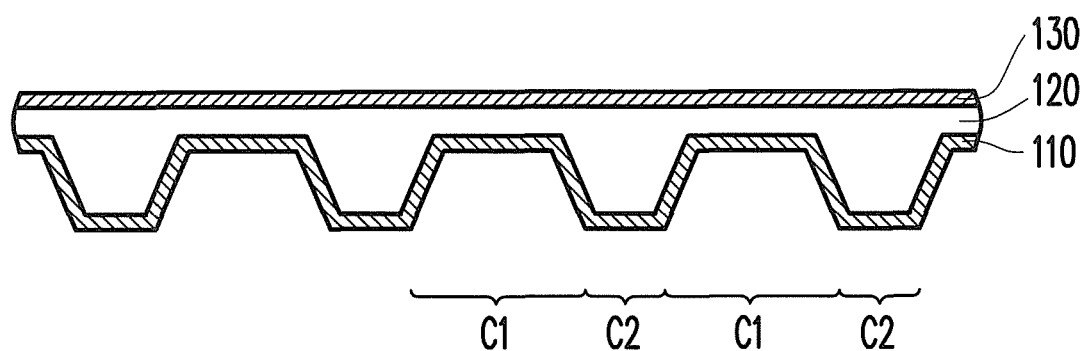

Thereafter, referring to FIG. 1C and FIG. 1D, the metal substrate 20a and the carrier 10a are removed to expose the first metal layer 110 and define a plurality of cavity regions C1 and a plurality of connecting regions C2 connected with the cavity regions C1, wherein each of the cavity regions C1 is located between two adjacent connecting regions C2. Here, the positions of the cavity regions C1 correspond to the position of the metal substrate 20a, and the positions of the connecting regions C2 respectively correspond to the positions of the openings 22a. It is known from the above that, in this embodiment, the cavity regions C1 and the connecting regions C2 are formed using the metal substrate 20a having the openings 22a, and the carrier 10a is used to support the metal substrate 20a. Therefore, the metal substrate 20a and the carrier 10a can be removed after the cavity regions C1 and the connecting regions C2 are formed.

Figure 1E:
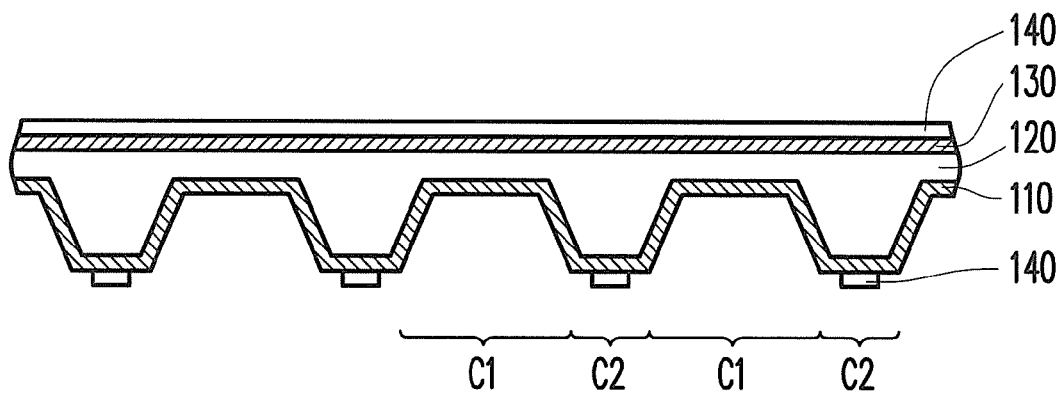

Following the above, referring to FIG. 1E, a dry film layer 140 is formed on the second metal layer 130 and portions of the first metal layer 110, which are located in the connecting regions C2.

Figure 1F:
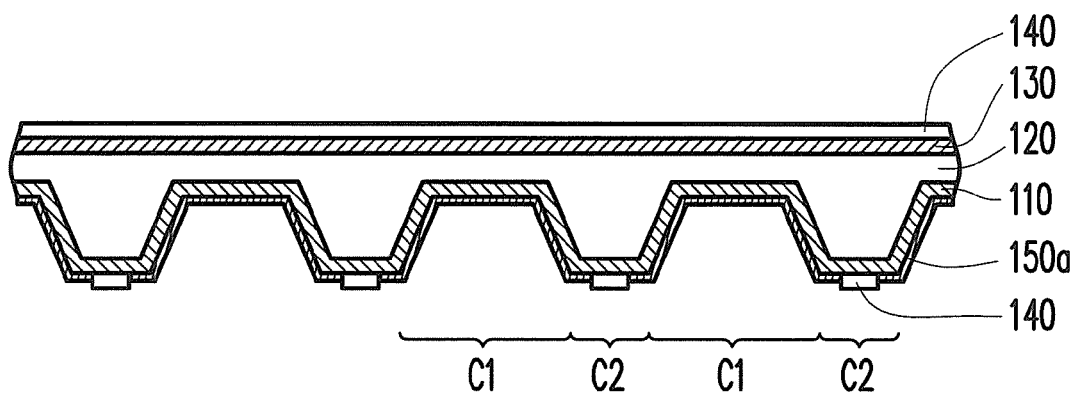

Next, referring to FIG. 1F, an electroplating process is performed with the dry film layer 140 as an electroplating mask, so as to electroplate a third metal layer 150a on the portions of the first metal layer 110 exposed by the dry film layer 140. Here, a material of the third metal layer 150a is a nickel, for example. However, it should be noted that the invention is not limited thereto.

Figure 1G:
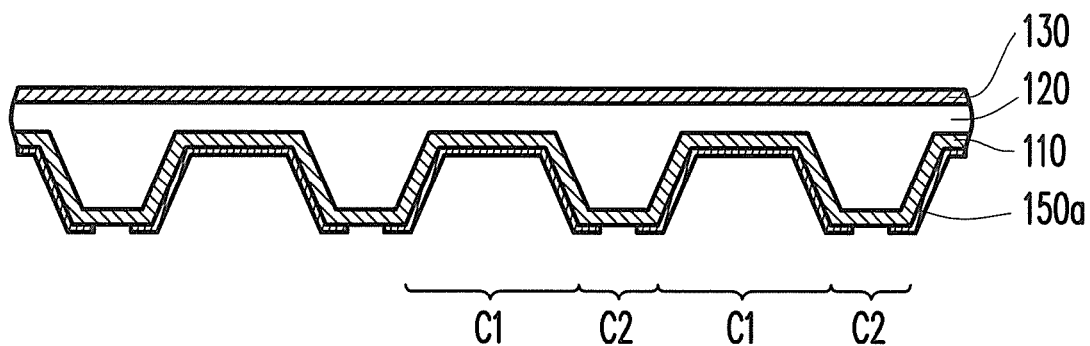

Then, referring to FIG. 1G, the dry film layer 140 is removed to expose the second metal layer 130 and the portions of the first metal layer 110, which are located in the connecting regions C2.

Figure 1H:
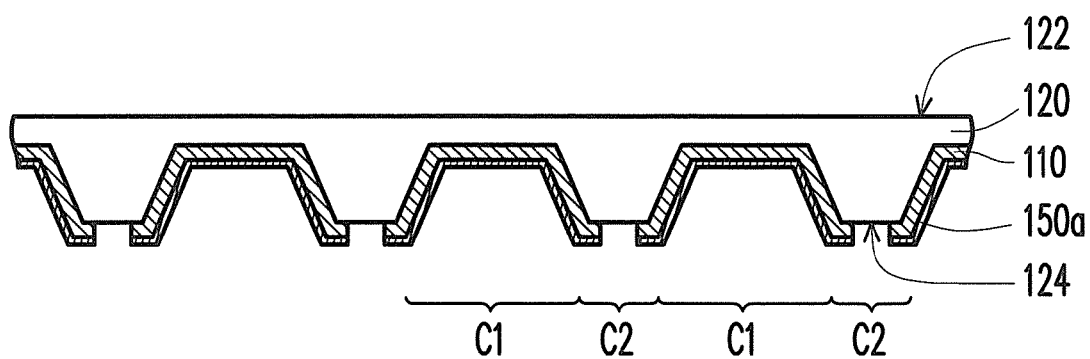

Thereafter, referring to FIG. 1H, the third metal layer 150a is used as an etching mask for removing the second metal layer 130 and the portions of the first metal layer 110 located in the connecting regions C2, which are exposed outside the third metal layer 150a, so as to expose an upper surface 122 and a portion of a lower surface 124 of the insulating layer 110.

Figure 1I:
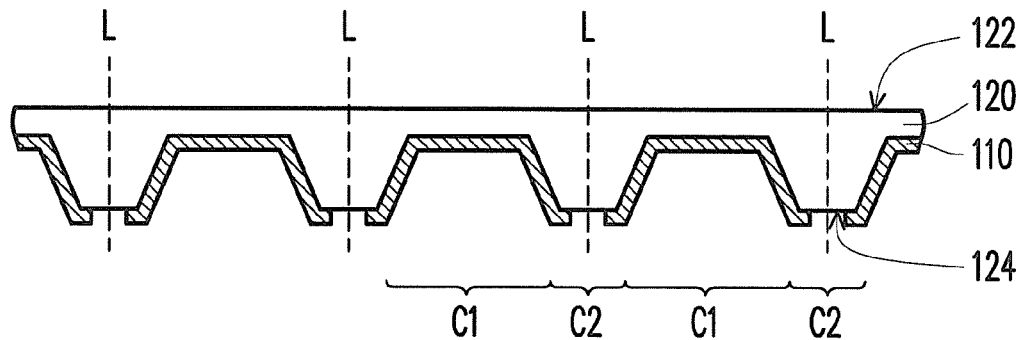

Afterward, referring to FIG. 1I, the third metal layer 150a is removed to expose the first metal layer 110. At this moment, the first metal layer 110 presents a discontinuous layer after the etching step of FIG. 1H.

Figure 1J:
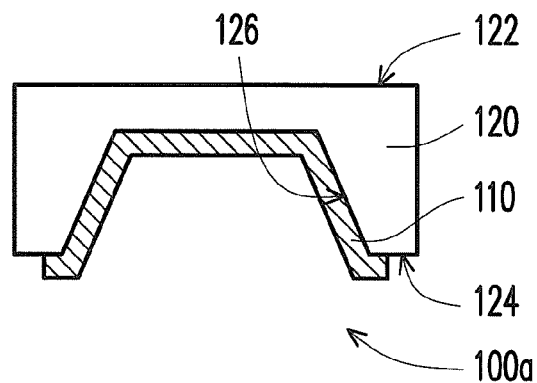

Finally, referring to FIG. 1I and FIG. 1J, a unitizing process is performed along a plurality of cutting lines L, so as to form a plurality of cover structures 100a that are independent of each other (only one is illustrated in FIG. 1J as an example). Accordingly, the manufacture of the cover structure 100a having a cavity 126 is completed.

In terms of the structure, referring to FIG. 1J again, the cover structure 100a of this embodiment includes the first metal layer 110 and the insulating layer 120. The insulating layer 120 has the upper surface 122, the lower surface 124 opposite to the upper surface 122, and the cavity 126 on the lower surface 124. The first metal layer 110 is disposed on the insulating layer 120, and the first metal layer 110 covers the cavity 126 and a portion of the lower surface 124.

Figure 2:
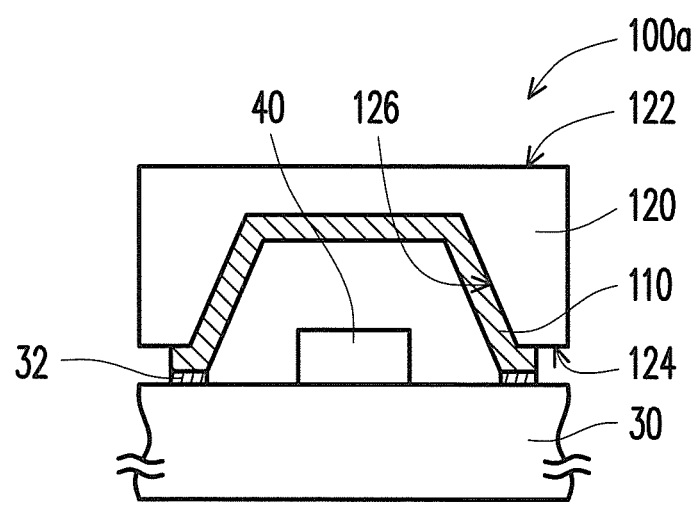
FIG. 2 is a schematic cross-sectional view illustrating the cover structure of FIG. 1J being disposed on a circuit board that carries an electronic device.

FIG. 2 is a schematic cross-sectional view illustrating the cover structure of FIG. 1J being disposed on a circuit board that carries an electronic device. With reference to FIG. 2, in this embodiment, the cover structure 100a is adapted for covering a circuit board 30 that carries at least one electronic device (one electronic device 40 is illustrated in FIG. 2). The cover structure 100a is structurally and electrically connected with a plurality of contacts 32 on the circuit board 30 via the first metal layer 110 on the lower surface 124 of the insulating layer 120 and positioned on the circuit board 30, wherein the electronic device 40 is located in the cavity 126 of the cover structure 100a. More specifically, the electronic device 40 is located in a space formed by the circuit board 30 and the cover structure 100a, and the first metal layer 110 surrounds the electronic device 40 to serve as an electro-magnetic wave shielding layer for effectively reducing the interference of an electro-magnetic wave from the outside and protecting the electronic device 40 on the circuit board 30 from being affected by signals. Here, the electronic device 40 is a micro-electro-mechanical device or an integrated circuit chip, for example. However, it should be noted that the invention is not limited thereto. Because the cover structure 100a of this embodiment may be electrically connected to an external circuit (such as the circuit board 30) via the first metal layer 110 on the lower surface 124 of the insulating layer 120, applicability of the cover structure 100a is increased.

Below several different embodiments are given to explain manufacturing methods of cover structures 100b and 100c. It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 3A:
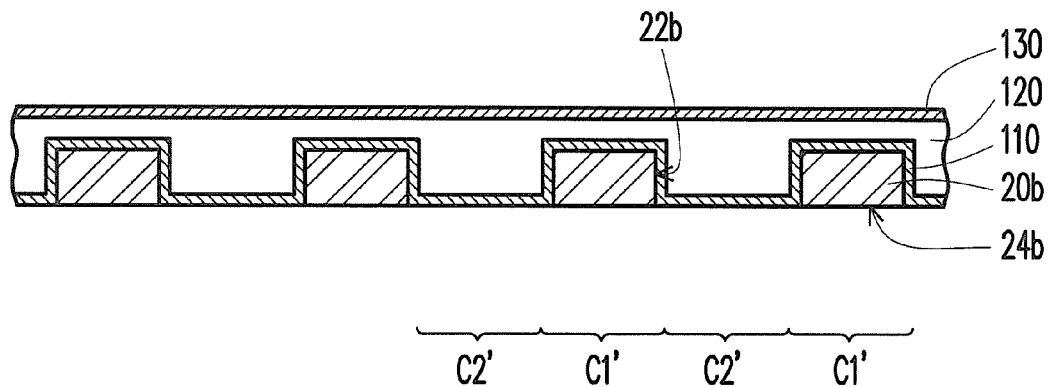
FIG. 3A to FIG. 3G are schematic cross-sectional views illustrating a manufacturing method of another cover structure of the invention.

FIG. 3A to FIG. 3G are schematic cross-sectional views illustrating a manufacturing method of another cover structure of the invention. The manufacturing method of the cover structure 100b (see FIG. 3G) of this embodiment is similar to the manufacturing method of the cover structure 100a of FIG. 1J. The only difference therebetween is that: after the step of FIG. 1C, namely, after the insulating layer 120 and the second metal layer 130 are laminated on a metal substrate 20b, the carrier 10a is removed to expose a bottom surface 24b of the metal substrate 20b and a portion of the first metal layer 110, as shown in FIG. 3A. At this moment, the locations of the metal substrate 20b may be defined as a plurality of cavity regions C1', and the locations of openings 22b may be defined as a plurality of connecting regions C2'. The first metal layer 110 exposed by removing the carrier 10a is located in the connecting regions C2'. The metal substrate 20b is similar to the metal substrate 20a. A difference therebetween lies in that: the openings 22b of the metal substrate 20b of this embodiment have uniform diameters.

Figure 3B:
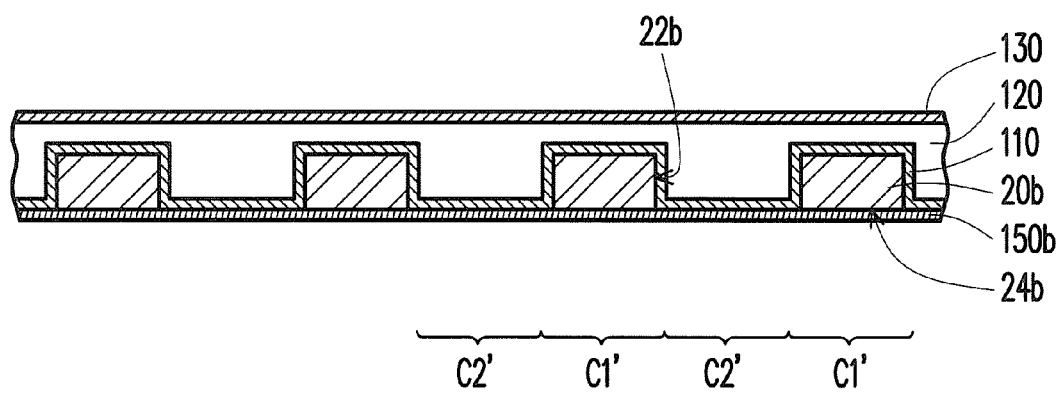

Next, referring to FIG. 3B, a third metal layer 150b is formed on the bottom surface 24b of the metal substrate 20b and portions of the first metal layer 110 located in the connecting regions C2'. Here, a material of the third metal layer 150b is copper, for example. However, it should be noted that the invention is not limited thereto.

Figure 3C:
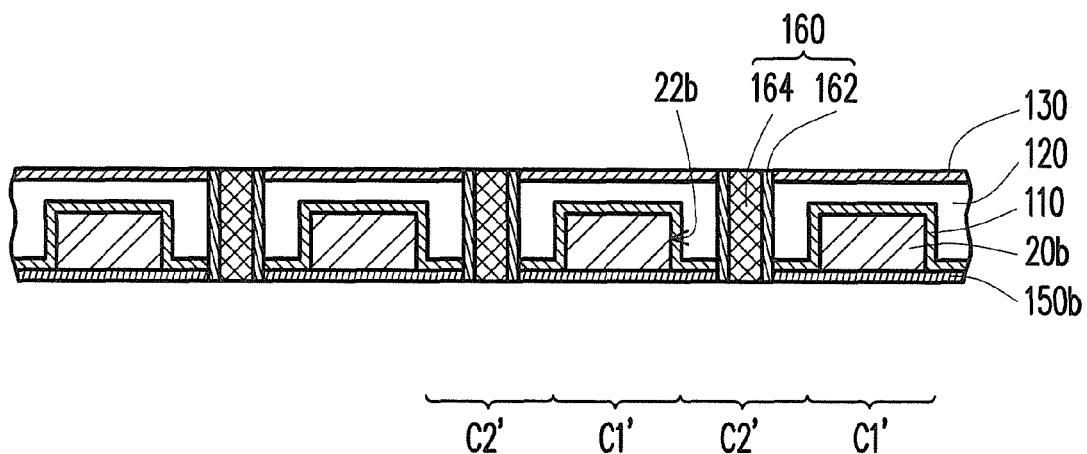

Then, referring to FIG. 3C, a plurality of conductive columns 160 are formed to penetrate the connecting regions C2', wherein the conductive columns 160 pass through the second metal layer 130, the insulating layer 120, the first metal layer 110, and the third metal layer 150b. Here, each of the conductive columns 160 is composed of an electroplating seed layer 162 and a conductive material 164.

Figure 3D:
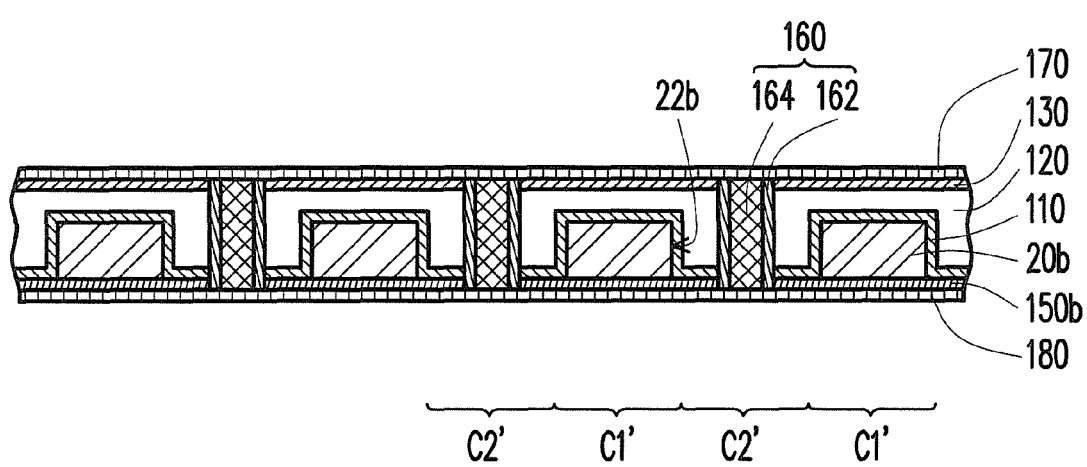

Thereafter, referring to FIG. 3D, a fourth metal layer 170 and a fifth metal layer 180 are respectively formed on the second metal layer 130 and the third metal layer 150b, wherein the fourth metal layer 140 and the fifth metal layer 180 respectively cover two opposite ends of the conductive columns 160. Here, materials of the fourth metal layer 170 and the fifth metal layer 180 are both copper, for example. However, it should be noted that the invention is not limited thereto.

Figure 3E:
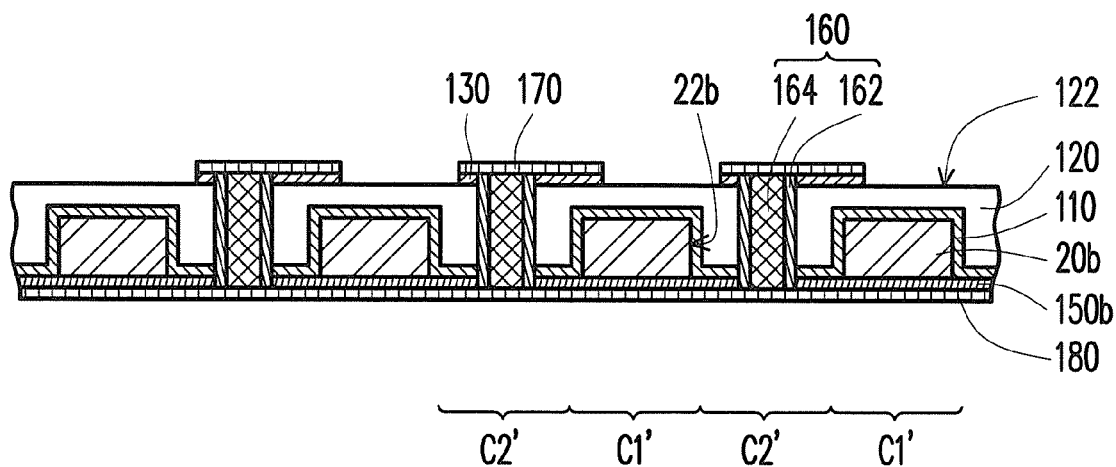

Next, referring to FIG. 3E, a portion of the fourth metal layer 170 and a portion of the second metal layer 130 are removed to expose a portion of an upper surface 122 of the insulating layer 120, wherein a method of removing the portion of the fourth metal layer 170 and the portion of the second metal layer 130 includes performing a patterning process, for example.

Figure 3F:
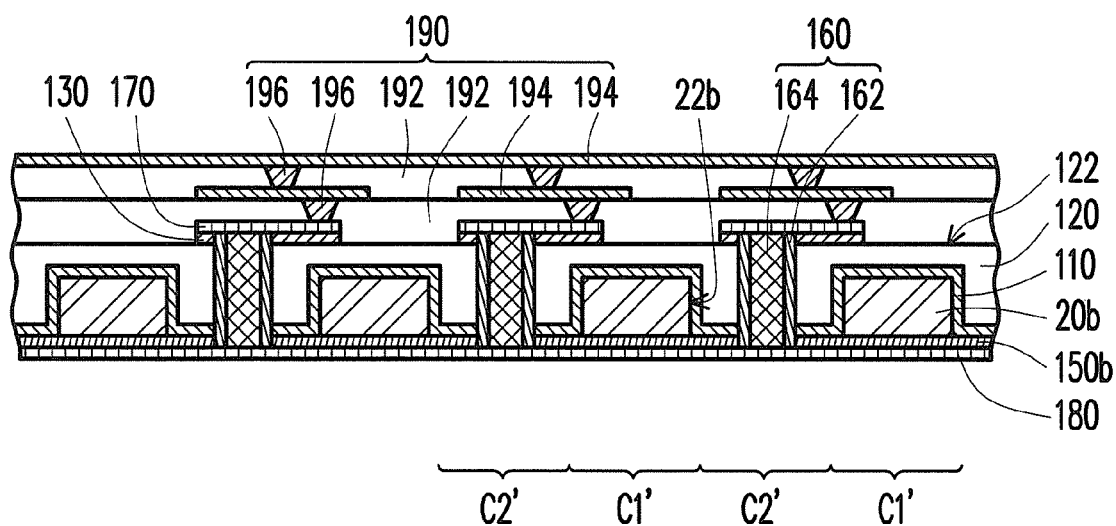

Following that, referring to FIG. 3F, an additional layer wiring structure 190 is formed on the exposed portion of the upper surface 122 of the insulating layer 120. In this embodiment, the additional layer wiring structure 190 includes at least one dielectric layer 192 (FIG. 3F schematically illustrates two dielectric layers 192), at least one patterned conductive layer 194 (FIG. 3F schematically illustrates two patterned conductive layers 194), and at least one conductive through-hole structure 196 passing through the dielectric layers 192. The dielectric layers 192 and the patterned conductive layers 194 are sequentially stacked on the upper surface 122 of the insulating layer 120, and the patterned conductive layers 194 are electrically connected with the conductive columns 160 through the conductive through-hole structures 196 and the fourth metal layer 170. It should be mentioned that the number of dielectric layers 192, the patterned wiring layers 194, and the conductive through-hole structures 196 of the additional layer wiring structure 190 in this embodiment may be varied upon actual demands. The invention poses no limitation on the number of said components.

Figure 3G:
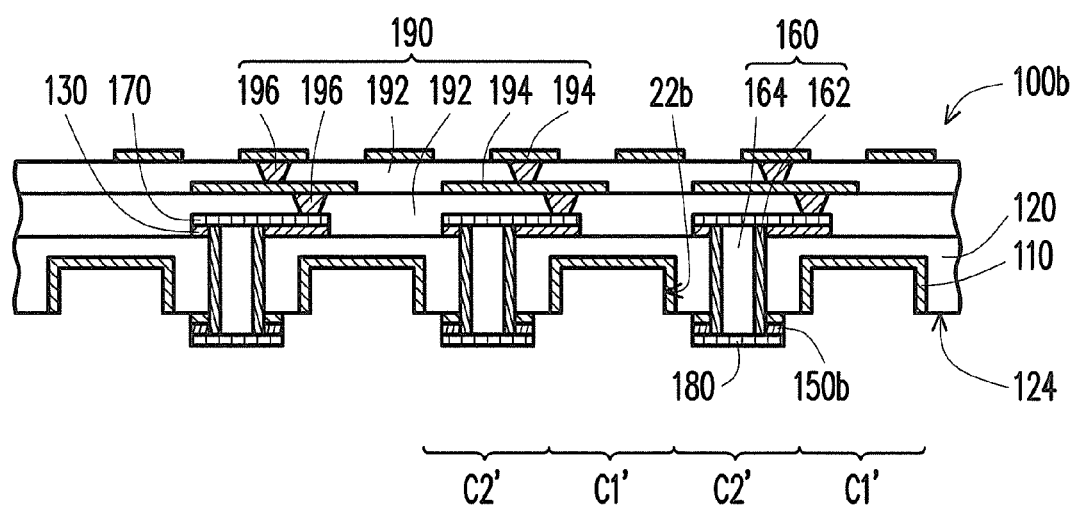

At last, referring to FIG. 3G, a portion of the fifth metal layer 180, a portion of the third metal layer 150b, the metal substrate 20b, and the portions of the first metal layer 110 located in the connecting regions C2' are removed to expose a portion of the first metal layer 110 located in the cavity regions C1' and a portion of the partial lower surface 124 of the insulating layer 120 located in the connecting regions C2'. Accordingly, the manufacture of the cover structure 100b is completed.

Because the cover structure 100b of this embodiment has the additional layer wiring structure 190, the cover structure 100b may be electrically connected to an external circuit (not shown) via the outmost patterned wiring layer 194 of the additional layer wiring structure 190 to increase the applicability of the cover structure 100b. Further, because the cover structure 100b of this embodiment is formed with the cavity regions C1', when the cover structure 100b is positioned on the circuit board 30 (see FIG. 2), the electronic device 40 on the circuit board 30 (see FIG. 2) is located in the cavity region C1', and the electronic device 40 is surrounded by the first metal layer 110, which can be deemed as an electro-magnetic wave shielding layer for effectively reducing the interference of an electro-magnetic wave from the outside and protecting the electronic device 40 on the circuit board 30 from being affected by signals. In a word, the cover structure 100b of this embodiment has the function of shielding EMI and has extensive application.

Figure 4A:
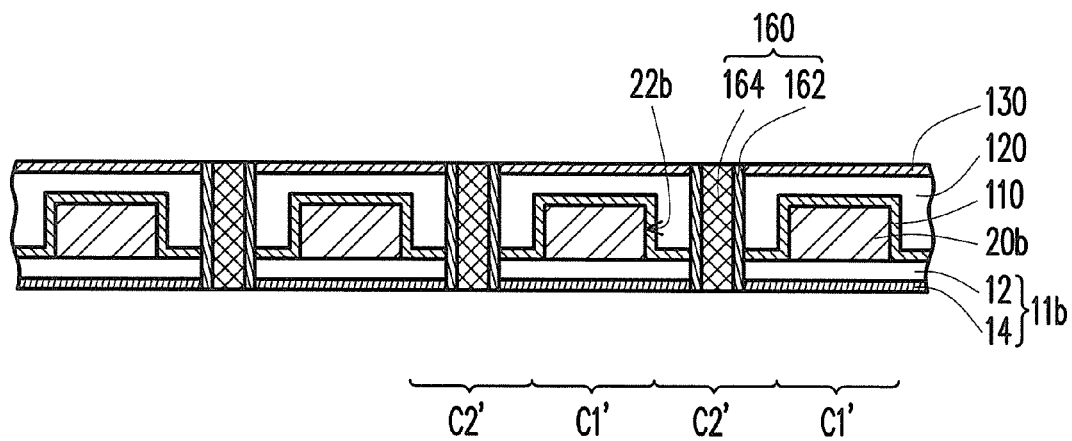
FIG. 4A to FIG. 4E are schematic cross-sectional views illustrating a manufacturing method of yet another cover structure of the invention.

FIG. 4A to FIG. 4E are schematic cross-sectional views illustrating a manufacturing method of yet another cover structure of the invention. The manufacturing method of a cover structure 100c (see FIG. 4E) of this embodiment is similar to the manufacturing method of the cover structure 100a of FIG. 1J. The only difference therebetween is that: after the step of FIG. 1C, namely, after the insulating layer 120 and the second metal layer 130 are laminated on the metal substrate 20b, a plurality of conductive columns 160 are formed to penetrate the second metal layer 130, the insulating layer 120, the first metal layer 110, and the carrier 11b, as shown in FIG. 4A. Here, the carrier 11b is formed of a core dielectric layer 12 and a copper foil layer 14, wherein the core dielectric layer 12 is located between the copper foil layer 14 and the metal substrate 20b. The metal substrate 20b is similar to the metal substrate 20a. A difference therebetween lies in that: the openings 22b of the metal substrate 20b of this embodiment have uniform diameters. At this moment, the locations of the metal substrate 20b may be defined as a plurality of cavity regions C1', and the locations of the openings 22b may be defined as a plurality of connecting regions C2'.

Figure 4B:
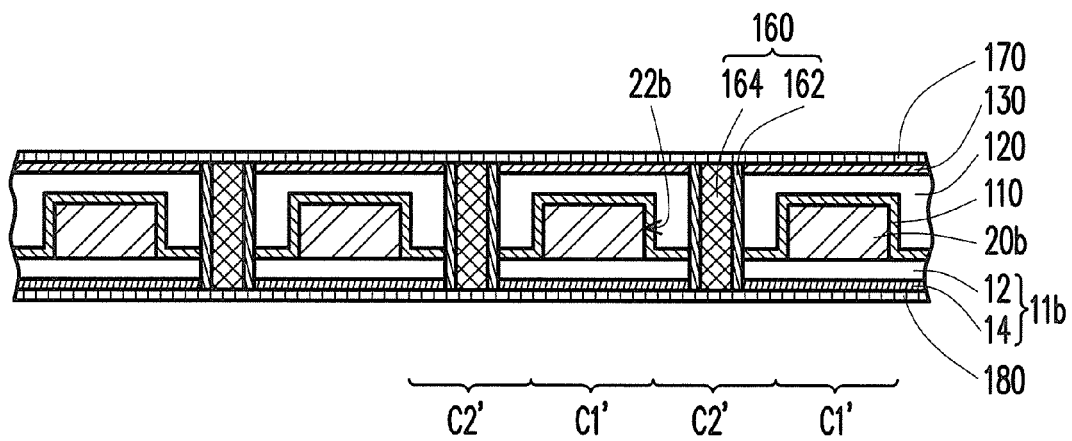

Thereafter, referring to FIG. 4B, a fourth metal layer 170 and a fifth metal layer 180 are respectively formed on the second metal layer 130 and the copper foil layer 14 of the carrier 11b, wherein the fourth metal layer 170 and the fifth metal layer 180 respectively cover two opposite ends of the conductive columns 160. Here, a material of the fourth metal layer 170 is copper, for example.

Figure 4C:
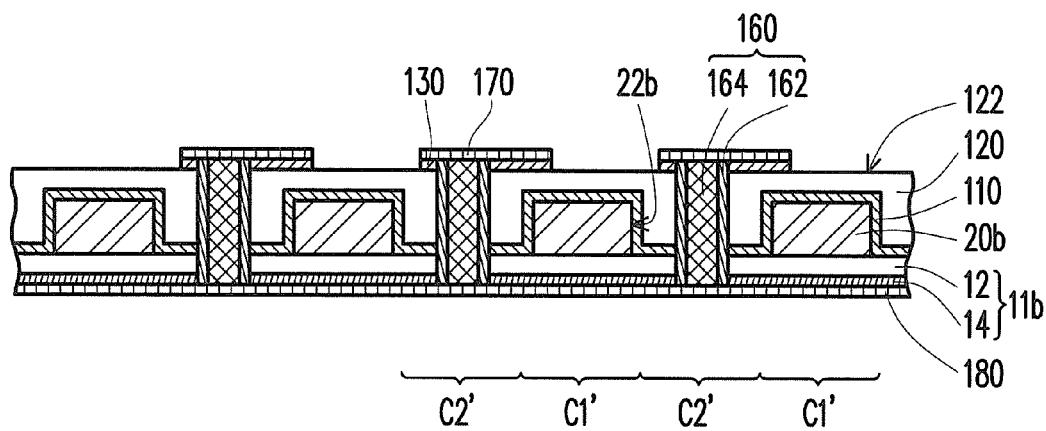

Next, referring to FIG. 4C, a portion of the fourth metal layer 170 and a portion of the second metal layer 130 are removed to expose a portion of the upper surface 122 of the insulating layer 120, wherein a method of removing the portion of the fourth metal layer 170 and the portion of the second metal layer 130 includes performing a patterning process, for example.

Figure 4D:
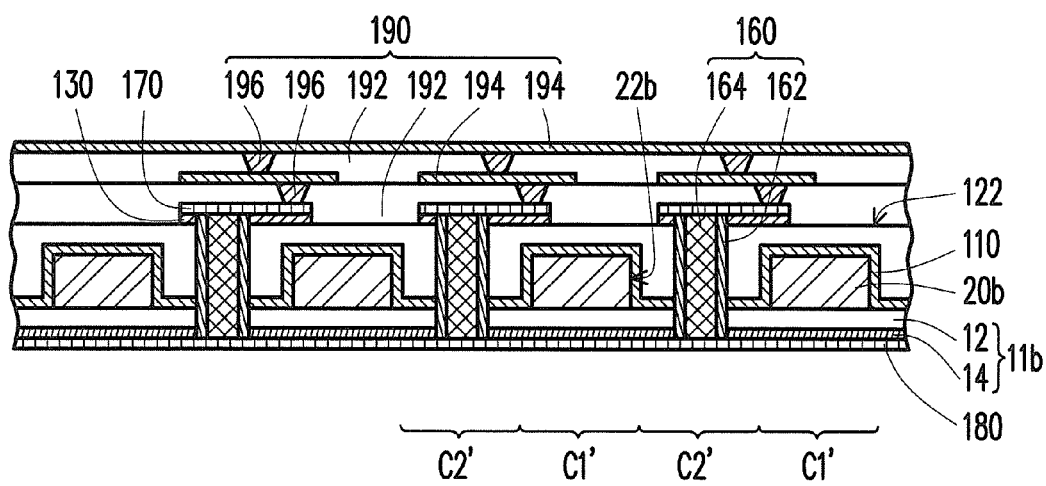

Following that, referring to FIG. 4D, an additional layer wiring structure 190 is formed on the exposed portion of the upper surface 122 of the insulating layer 120. In this embodiment, the additional layer wiring structure 190 includes at least one dielectric layer 192 (FIG. 4D schematically illustrates two dielectric layers 192), at least one patterned conductive layer 194 (FIG. 4D schematically illustrates two patterned conductive layers 194), and at least one conductive through-hole structure 196 passing through the dielectric layers 192. The dielectric layers 192 and the patterned conductive layers 194 are sequentially stacked on the upper surface 122 of the insulating layer 120, and the patterned conductive layers 194 are electrically connected with the conductive columns 160 through the conductive through-hole structures 196. It should be mentioned that the number of dielectric layers 192, the patterned wiring layers 194, and the conductive through-hole structures 196 of the additional layer wiring structure 190 in this embodiment may be varied upon actual demands. The invention poses no limitation on the number of said components.

Figure 4E:
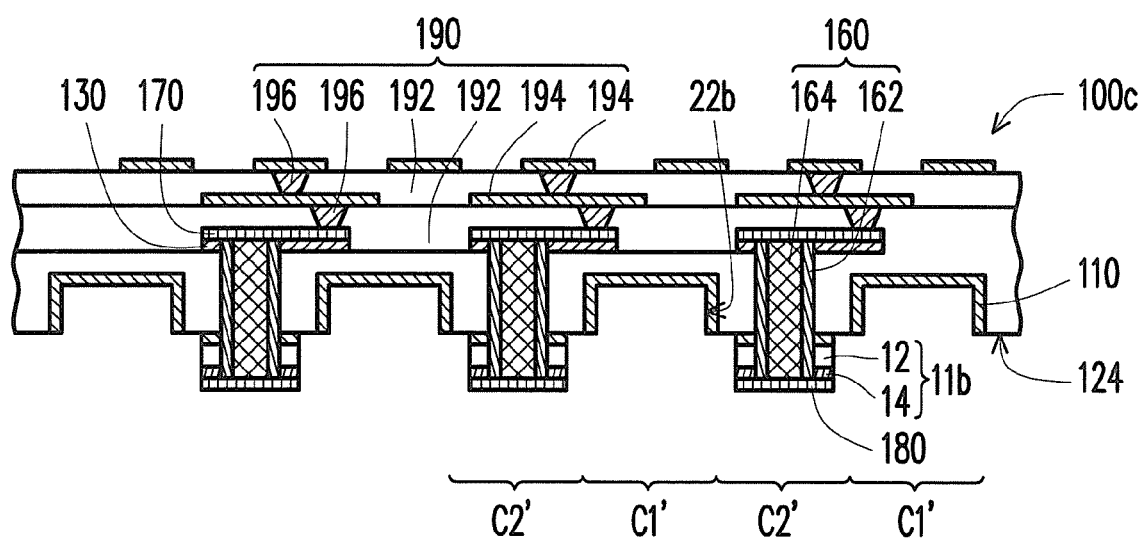

At last, referring to FIG. 4E, a portion of the fifth metal layer 180, a portion of the carrier 11b, the metal substrate 20b, and portions of the first metal layer 110 located in the connecting regions C2' are removed to expose a portion of the first metal layer 110 located in the cavity regions C1' and a portion of the partial lower surface 124 of the insulating layer 120 located in the connecting regions C2'. Accordingly, the manufacture of the cover structure 100c is completed.

Because the cover structure 100c of this embodiment has the additional layer wiring structure 190, the cover structure 100c may be electrically connected to an external circuit (not shown) via the outmost patterned wiring layer 194 of the additional layer wiring structure 190 to increase the applicability of the cover structure 100c. Further, because the cover structure 100c of this embodiment is formed with the cavity regions Cr, when the cover structure 100c is positioned on the circuit board 30 (see FIG. 2), the electronic device 40 on the circuit board 30 (see FIG. 2) is located in the cavity region C1', and the electronic device 40 is surrounded by the first metal layer 110, which can be deemed as an electro-magnetic wave shielding layer, for effectively reducing the interference of an electro-magnetic wave from the outside and protecting the electronic device 40 on the circuit board 30 from being affected by signals. In a word, the cover structure 100c of this embodiment has the function of preventing EMI and has extensive application.

To sum up, the cover structure of the invention includes the cavity with the metal layer disposed thereon. Therefore, when the cover structure is positioned on the circuit board, the electronic device on the circuit board is located in the cavity and surrounded by the metal layer. The metal layer can be deemed as an electro-magnetic wave shielding layer for effectively reducing the interference of an electro-magnetic wave from the outside and protecting the electronic device on the circuit board from being affected by signals. Moreover, through the layout of the internal patterned wiring layer (that is, the patterned wiring layer and the conductive through-hole structure of the additional layer wiring structure) and formation of the conductive through-hole structure, the cover structure of the invention increases the applicability of the circuit.

Because the cover structure of the invention has the patterned wiring layer (i.e. the patterned wiring layer) on the external side, the cover structure of the invention not only has the anti-EMI function but also can be electrically connected to an external circuit via the external patterned wiring layer to increase the applicability of the cover structure.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A manufacturing method of a cover structure, the manufacturing method comprising:
    disposing a metal substrate on a carrier having a surface, and the metal substrate comprising a plurality of openings that expose a portion of the surface of the carrier, wherein the metal substrate comprises a first metal layer formed thereon which is disposed conformally with the metal substrate, and the first metal layer covers the portion of the surface of the carrier exposed by the openings;
    laminating an insulating layer and a second metal layer located on the insulating layer on the metal substrate, wherein the insulating layer is located between the first metal layer and the second metal layer, and covers the first metal layer and fills the openings; and
    removing the metal substrate and the carrier to expose the first metal layer and define a plurality of cavity regions and a plurality of connecting regions connected with the cavity regions, wherein positions of the cavity regions correspond to positions of the metal substrate, and positions of the connecting regions correspond to the positions of the openings.

2. The manufacturing method as recited in claim 1, further comprising:
    after removing the metal substrate and the carrier, forming a dry film layer on the second metal layer and a portion of the first metal layer located in the connecting regions;
    performing an electroplating process with the dry film layer as an electroplating mask to electroplate a third metal layer on a portion of the first metal layer exposed by the dry film layer;
    removing the dry film layer to expose the second metal layer and the portion of the first metal layer located in the connecting regions;
    removing the second metal layer and the portion of the first metal layer located in the connecting regions, which are exposed outside the third metal layer, with the third metal layer as an etching mask to expose an upper surface and a portion of a lower surface of the insulating layer; and
    removing the third metal layer to expose the first metal layer.

3. The manufacturing method as recited in claim 1, wherein the step of removing the metal substrate and the carrier comprises:
    removing the carrier to expose a bottom surface of the metal substrate and the portion of the first metal layer located in the connecting regions;
    forming a third metal layer on the bottom surface of the metal substrate and the portion of the first metal layer located in the connecting regions;
    forming a plurality of conductive columns to penetrate the connecting regions, wherein the conductive columns penetrate the second metal layer, the insulating layer, the first metal layer, and the third metal layer;
    forming a fourth metal layer and a fifth metal layer respectively on the second metal layer and the third metal layer, wherein the fourth metal layer and the fifth metal layer respectively cover two opposite ends of the conductive columns;
    removing a portion of the fourth metal layer and a portion of the second metal layer to expose a portion of an upper surface of the insulating layer;
    forming an additional layer wiring structure on the exposed insulating layer; and
    removing a portion of the fifth metal layer, a portion of the third metal layer, the metal substrate, and the portion of the first metal layer located in the connecting regions to expose a portion of the first metal layer located in the cavity regions and a portion of a lower surface of the insulating layer located in the connecting regions.

4. The manufacturing method as recited in claim 3, wherein the additional layer wiring structure comprises at least one dielectric layer, at least one patterned conductive layer, and at least one conductive through-hole structure penetrating the at least one dielectric layer, wherein the at least one dielectric layer and the at least one patterned conductive layer are sequentially stacked on the insulating layer, and the at least one patterned conductive layer is electrically connected with the conductive columns via the at least one conductive through-hole structure and the fourth metal layer.

5. The manufacturing method as recited in claim 1, wherein the carrier comprises a core dielectric layer and a copper foil layer, and the core dielectric layer is located between the copper foil layer and the metal substrate.

6. The manufacturing method as recited in claim 5, further comprising:
    after laminating the insulating layer and the second metal layer on the metal substrate, forming a plurality of conductive columns penetrating the second metal layer, the insulating layer, the first metal layer, the core dielectric layer, and the copper foil layer;
    forming a fourth metal layer and a fifth metal layer respectively on the second metal layer and the copper foil layer, wherein the fourth metal layer and the fifth metal layer respectively cover two opposite ends of the conductive columns;
    removing a portion of the fourth metal layer and a portion of the second metal layer to expose a portion of an upper surface of the insulating layer;
    forming an additional layer wiring structure on the exposed insulating layer; and
    removing a portion of the fifth metal layer, a portion of the core dielectric layer, a portion of the copper foil layer, the metal substrate, and the portion of the first metal layer located in the connecting regions to expose a portion of the first metal layer located in the cavity regions and a portion of a lower surface of the insulating layer located in the connecting regions.

7. The manufacturing method as recited in claim 6, wherein the additional layer wiring structure comprises at least one dielectric layer, at least one patterned conductive layer, and at least one conductive through-hole structure penetrating the at least one dielectric layer, wherein the at least one dielectric layer and the at least one patterned conductive layer are sequentially stacked on the insulating layer, and the at least one patterned conductive layer is electrically connected with the conductive columns via the at least one conductive through-hole structure and the fourth metal layer.

8. The manufacturing method as recited in claim 1, further comprising:
after removing the metal substrate and the carrier, performing a unitizing process to form a plurality of cover structures that are independent of each other.

9. A cover structure, adapted for covering a circuit board that carries at least one electronic device, the cover structure comprises:
an insulating layer comprising an upper surface, a lower surface opposite to the upper surface, and at least one cavity on the lower surface;
a metal layer disposed on the insulating layer and covering the at least one cavity and a portion of the lower surface, wherein the circuit board is electrically connected with the metal layer on the lower surface of the insulating layer, and the at least one electronic device is located between the circuit board and the metal layer;
at least one conductive column penetrating the insulating layer and embedded in the insulating layer; and
an additional layer wiring structure disposed on the insulating layer, wherein the additional layer wiring structure comprises at least one dielectric layer, at least one patterned conductive layer, and at least one conductive through-hole structure penetrating the at least one dielectric layer, wherein the at least one dielectric layer and the at least one patterned conductive layer are sequentially stacked on insulating layer, and the at least one patterned conductive layer is electrically connected with the at least one conductive column via the at least one conductive through-hole structure.

* * * * *